United States Patent [19]
Okada et al.

[11] Patent Number: 5,550,390
[45] Date of Patent: Aug. 27, 1996

[54] SEMICONDUCTOR DEVICE AND MANUFACTURING METHOD THEREOF

[75] Inventors: Teruhiko Okada; Hirotada Kuriyama; Yoshio Kohno, all of Hyogo-ken, Japan

[73] Assignee: Mitsubishi Denki Kabushiki Kaisha, Tokyo, Japan

[21] Appl. No.: 453,726

[22] Filed: May 30, 1995

Related U.S. Application Data

[63] Continuation of Ser. No. 152,784, Nov. 16, 1993, abandoned, which is a continuation of Ser. No. 925,157, Aug. 6, 1992, abandoned.

[30] Foreign Application Priority Data

Aug. 8, 1991 [JP] Japan ..................... 3-199434

[51] Int. Cl.⁶ .......... H01L 29/76; H01L 31/036; H01L 31/112; H01L 27/01
[52] U.S. Cl. ............. 257/66; 257/67; 257/347
[58] Field of Search ................ 257/66, 67, 347

[56] References Cited

FOREIGN PATENT DOCUMENTS

| | | | |
|---|---|---|---|
| 2503864 | 8/1976 | Germany | 257/66 |
| 3533032 | 3/1987 | Germany | 257/66 |
| 56-88354 | 7/1981 | Japan | 257/66 |
| 57-132365 | 8/1982 | Japan | 257/347 |
| 58-124261 | 7/1983 | Japan | 257/67 |
| 58-218169 | 12/1983 | Japan | 257/66 |
| 59-111368 | 6/1984 | Japan | 257/66 |
| 59-108360 | 6/1984 | Japan | 257/66 |
| 1229229 | 9/1989 | Japan . | |
| 1276672 | 11/1989 | Japan | 257/347 |
| 341774 | 2/1991 | Japan . | |
| 3048463 | 3/1991 | Japan . | |
| 3293773 | 12/1991 | Japan | 257/66 |
| WO92/06490 | 4/1992 | WIPO . | |

OTHER PUBLICATIONS

"256 kbit CMOS EPROM HN27C256", Hideaki Takahashi et al., 8297 Hitachi Review, vol. 34, No. 6, Dec., 1985, pp. 295–298.

International Electron Devices Meeting, 1990, San Francisco, California, Dec. 9–12, 1990 pp. 18.3.1–18.3.4.

*Primary Examiner*—Stephen D. Meier
*Attorney, Agent, or Firm*—Lowe, Price, LeBlanc & Becker

[57] ABSTRACT

A semiconductor device includes a gate electrode, and a semiconductor layer formed on the main surface of the gate electrode with a gate oxide film therebetween. The semiconductor layer has a channel region opposing the main surface of gate electrode and source/drain regions having the channel region therebetween, and is formed so that the bent angle in the vicinity of the boundaries of the channel region and the source/drain regions is beyond 90°. Thus, the semiconductor layer formed in a thin film transistor has no orthogonal bent, and, therefore the concentration of electric fields is suppressed, improving the performance of the thin film transistor.

7 Claims, 14 Drawing Sheets

SEMICONDUCTOR DEVICE AND MANUFACTURING METHOD THEREOF

This application is a continuation of application Ser. No. 08/152,784 filed Nov. 16, 1993, now abandoned, which is a continuation of application Ser. No. 07/925,157, filed Aug. 6, 1992, now abandoned.

BACKGROUND OF THE INVENTION

1. Field of the Invention

The present invention relates generally to semiconductor devices and manufacturing methods thereof, and more specifically, to a structure of a thin film transistor and a manufacturing method thereof.

2. Description of the Background Art

In recent years, for meeting a demand for shrinking the size of a semiconductor device, development on a thin film transistor (hereinafter referred to as TFT) to be formed as a field effect transistor by forming a semiconductor thin film on an insulator substrate and providing a channel in the semiconductor thin film has been under way.

A description of a structure of the TFT follows in conjunction with the accompanying drawings.

Referring to FIG. 38, a gate electrode 2 of polysilicon is formed on an interlayer insulating film 1 formed on a bulk transistor (not shown). A gate oxide film 6 is formed along the top flat portion and sidewalls of gate electrode 2. A semiconductor layer 7 is formed along gate oxide film 6. Formed at a position of semiconductor layer 7 opposite to gate electrode 2 is a channel region 7a. Source/drain regions 7b, 7c are formed at positions having channel region 7a therebetween.

A description of a manufacturing process of a TFT having the above-stated structure follows in conjunction with FIGS. 39–45.

Referring to FIG. 39, an interlayer insulating film 1 is formed as thick as 1500 nm on a bulk transistor (not shown) by thermal chemical vapor deposition. A polysilicon layer 2 to be the gate electrode 2 of the TFT is deposited as thick as 200 nm on interlayer insulating film 1 by means of thermal chemical vapor deposition.

Referring to FIG. 40, a resist film 4 having a prescribed form is formed on the surface of polysilicon layer 2 by a photolithography technique. Referring to FIG. 41, using resist film 4 as mask, polysilicon layer 2 is subjected to anisotropic reactive ion etching to form gate electrode 2.

Referring to FIG. 42, resist film 4 is etched away. Referring to FIG. 43, an oxide film 6 for forming a gate oxide film having a thickness of 50 nm is formed on the surfaces of gate electrode 2 and interlayer insulating film 1 by thermal CVD. A polysilicon layer 7 to form the semiconductor layer of the TFT is deposited as thick as 50 nm on oxide film 6 by thermal chemical vapor deposition.

Referring to FIG. 44, a resist film 8 is formed on the surface of polysilicon layer 7. Resist film 8 is patterned into a prescribed form by means of a photolithography technique or the like. Using resist film 8 as mask, an impurity, for example, $1\times10^{15}$ $(cm^{-2})$ of boron for forming source/drain regions is implanted into polysilicon layer 7.

Referring to FIG. 45, resist film 8 is etched away. Thus formed is the TFT having channel region 7a in the region of polysilicon layer 7 opposite to the gate electrode 2 and source/drain regions 7b, 7c at the positions having channel region 7a therebetween.

The TFT having the structure described above, however, suffers from the following disadvantage. Referring to FIG. 45, gate electrode 2 is formed by subjecting the polysilicon layer to anisotropic reactive iron etching. Gate electrode 2 therefore takes a substantially rectangular form. Thus, with gate electrode 2 having a rectangular form, substantially orthogonal edges 9, 9 are produced in oxide film 6 and polysilicon layer 7 formed along gate electrode 2. Electric fields are likely to concentrate on these edges 9, 9, resulting in hot carriers or the like. The hot carriers enter into gate oxide film 6, thus deteriorating the insulation of gate oxide film 6.

SUMMARY OF THE INVENTION

It is an object of the present invention to provide a semiconductor device having a structure allowing formation of a gate oxide film and a channel layer with no orthogonal edge portions created in the gate oxide film and a semiconductor layer covering a gate electrode, in a thin film transistor (TFT).

Another object of the present invention is to provide a manufacturing method of a semiconductor device allowing formation of a gate oxide film and a channel layer with no orthogonal edges formed in the gate oxide film and a semiconductor layer and prevention of the concentration of electric fields in a step of forming the gate oxide film and semiconductor layer covering a gate oxide film in a thin film transistor (TFT).

A semiconductor device according to the present invention, in one aspect, includes a gate electrode, a semiconductor layer, and an insulating layer formed interposed between the gate electrode and the semiconductor layer. The semiconductor layer includes a channel region of first type conductivity, and source/drain regions of second type conductivity having the channel region therebetween. The gate electrode has a main surface opposite to the channel region, and sidewalls positioned on both right and left sides of the main surface. The insulating film is formed in contact with the surface of the semiconductor layer in its entire region, and in contact with the gate electrode at least in the main surface of the gate electrode opposite to the channel region, while the semiconductor layer is formed so that its bent angle is beyond 90° at each of positions in the vicinities of the boundaries of the channel region and the source/drain regions.

According to the semiconductor device, a channel layer of orthogonal bent is not formed in the semiconductor layer formed on the gate electrode with the gate oxide film therebetween. This suppresses the concentration of electric fields as generated at the orthogonal bents of the conventional channel layer. Furthermore, the hot carriers can be prevented from being implanted into the gate insulating film in the semiconductor layer.

The semiconductor device according to the present invention in another aspect includes a gate electrode formed on an insulator and having a central flat portion and inclined sidewalls descending from both right and left sides of the central flat portion to the right and left, a first insulating layer formed in contact with the area along both right and left sides of the central flat portion of the gate electrode to the inclined sidewalls, a second insulating layer formed on the surfaces of the gate electrode and first insulating layer, a semiconductor layer of first type conductivity formed on the surface of the second insulating layer. The semiconductor layer of the first type conductivity has a channel region of the first type conductivity at a position opposite to the central flat portion of the gate electrode, and source/drain regions of second type conductivity at positions having the channel region therebetween.

According to the semiconductor device, a channel layer of an orthogonal bent is not formed in the semiconductor layer formed on the gate electrode with the oxide film therebetween. This can suppress the concentration of electric fields as generated at the orthogonal bents of the conventional semiconductor device. Furthermore, introduction of hot carriers into the gate insulating film in the semiconductor device can be prevented.

A method of manufacturing a semiconductor device according to the present invention in one aspect includes forming a conductor layer on the surface of an insulator, forming a nitride film on the surface of the conductor layer, forming a resist film at a prescribed position on the surface of the nitride film, etching the nitride film to be formed into a shape corresponding to the resist film, and removing the resist film. The method further includes, after the removal of the resist film, thermally oxidizing the entire surface using the nitride film as mask to form a gate electrode having a central flat portion and inclined sidewalls descending rightward and leftward, respectively from both right and left sides of the central flat portion, and a first insulating layer of a thermally oxidized film along both right and left sides of the central flat portion and inclined side walls of the gate electrode, and after the removal of the nitride film, forming a second insulating layer on the surfaces of the gate electrode and the first insulating layer, and forming a semiconductor layer of first type conductivity on the surface of the second insulating layer.

The method further includes forming a channel region of the first type conductivity at a position opposite to the central flat portion of the gate electrode in the semiconductor layer of the first type conductivity and source/drain regions of the second type conductivity at positions having the channel region therebetween, by forming mask on the surface of the gate electrode at the position opposite to the central flat portion and implanting an impurity of the second type conductivity.

According to the method of manufacturing the semiconductor device, inclined sidewalls descending rightward and leftward from the right and left sides of gate electrode is provided, and an insulating layer is formed along the sidewalls. Thus, a channel layer of an orthogonal bent is not formed in the gate oxide film and the semiconductor layer formed along the gate electrode and the insulating layer. This suppresses the concentration of electric fields as generated at the orthogonal bent in the case of the conventional channel layer. Furthermore, hot carriers are prevented from being implanted into the gate insulating film in the semiconductor device.

A semiconductor device according to the present invention in a still further aspect includes a gate electrode having a central flat portion and sidewalls formed broaden downwardly at a prescribed inclination from the both ends, an insulating film formed along the central flat portion and sidewalls of the gate electrode, and a semiconductor layer formed along the surface of the insulating film. The semiconductor layer has a channel region of first type conductivity at the position opposite to the central flat portion of the gate electrode and source/drain regions of second type conductivity at the position having the channel region therebetween.

According to the semiconductor device, a channel layer formed of an orthogonal bent is not formed in the semiconductor layer formed on the gate electrode with the oxide film therebetween. Thus, the concentration of electric fields as generated in the case of the orthogonal bent of the conventional semiconductor device can be suppressed, and hot carriers can be prevented from being implanted into the gate electrode in the semiconductor layer.

A manufacturing method of a semiconductor device according to the present invention in another aspect includes forming a conductor layer on the surface of an insulator, forming a resist film having a central flat portion on the surface of the conductor layer and inclined sidewalls broaden downwardly from the right and left ends of the central flat portion at a prescribed inclination, and forming a gate electrode formed of a central flat portion and inclined sidewalls broaden downwardly at a prescribed angle with respect to the right and left sides of the central flat portion by etching the conductor layer using the resist film as mask. The method further includes forming an insulating film along the central flat portion and inclined sidewalls of the gate electrode, forming a semiconductor layer of first type conductivity along the surface of the insulating film, forming on the mask of the semiconductor layer at a position opposite to the gate electrode, and forming a channel region of the first type conductivity at a position of the semiconductor layer of the first type conductivity opposite to the gate electrode, and source/drain regions of second type conductivity at positions having the channel region therebetween.

According to the manufacturing method of the semiconductor device, the gate electrode formed of the central flat portion and inclined sidewalls broaden downwardly at a prescribed inclination with respect to right and left sides of the central flat portion, and, therefore, a channel region formed of an orthogonal bent is not formed in the insulating film and semiconductor layer formed on the gate electrode. Accordingly, the concentration of electric fields as generated in the case of the orthogonal bent of the conventional semiconductor device can be suppressed, and carriers can be prevented from being implanted into the gate insulating film in the semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description of embodiments of a thin film transistor (TFT) in accordance with the present invention follows in conjunction with the accompanying drawings.

Figure 1:
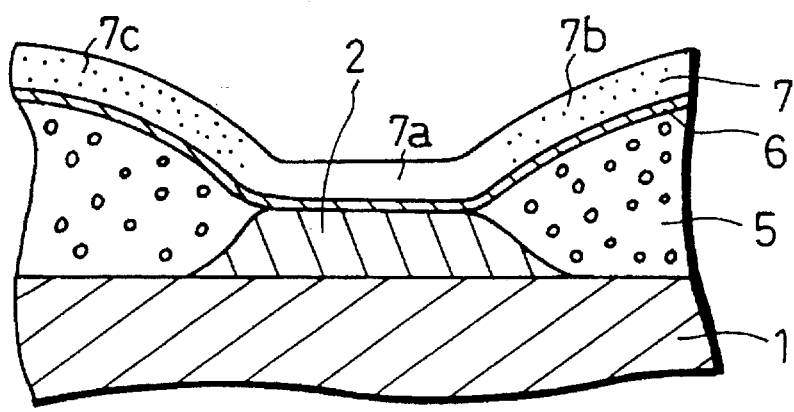
FIG. 1 is a cross sectional view showing a structure of a thin film transistor in accordance with a first embodiment of the present invention.

A structure of a TFT in accordance with the first embodiment of the present invention will be described in conjunction with FIG. 1.

The TFT according to the first embodiment has an interlayer insulating film 1 formed on a bulk transistor (not shown). A gate electrode 2 having a central flat portion and inclined sidewalls descending rightward and leftward from the right and left ends of the central flat portion is formed on interlayer insulating film 1. First insulating layers 5, 5 are formed in contact with and along the right and left ends of the central flat portion of the gate electrode and the inclined sidewalls.

A gate oxide film 6 which is a second insulating layer is formed on the surfaces of gate electrode 2 and first insulting layers 5, 5. A semiconductor layer 7 of first type conductivity, for example, p type is formed on the surface of gate oxide film 6. A P type channel region 7a is formed on the p type semiconductor layer at the position opposing the central flat portion. Source/drain regions 7b, 7c of second type conductivity, for example, n type is formed at the positions of p type semiconductor layer 2 having channel region 7a therebetween.

A description of a manufacturing process of a TFT having the above-states structure follows.

Figure 2:
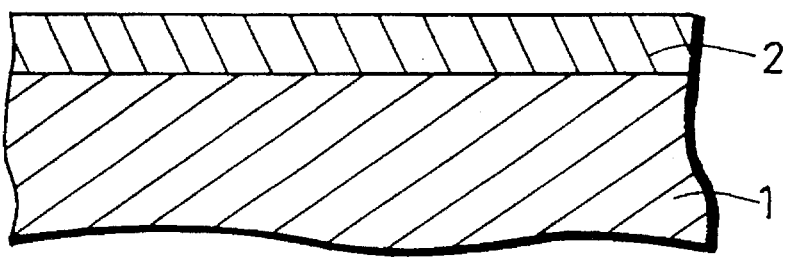
FIGS. 2 to 10 are cross sectional views showing a manufacturing process of the thin film transistor in accordance with the first embodiment of the present invention.
Figure 3:
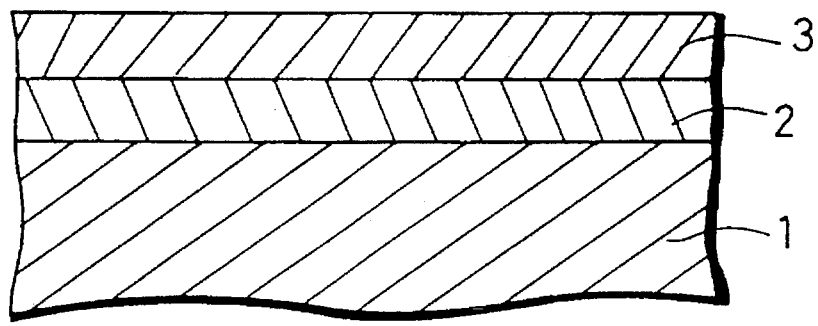
Figure 4:
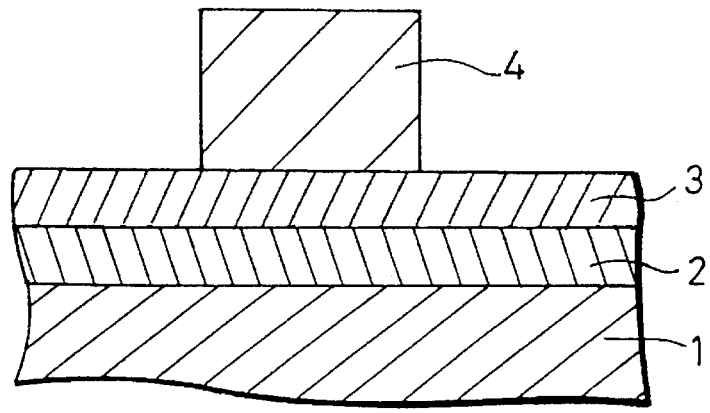

Referring to FIG. 2, interlayer insulating film 1 is formed on the bulk transistor (not shown). A polysilicon layer 2 is deposited as thick as 200 nm on interlayer insulating film 1 by means of thermal chemical vapor deposition. Referring to FIG. 3, a nitride film 3 having a thickness of 200 nm is formed on polysilicon layer 2 by thermal CVD. Referring to FIG. 4, a resist film is applied onto nitride film 3. Thereafter, the resist film is patterned by a photolithography technique, to form a resist film 4 having a prescribed form.

Figure 5:
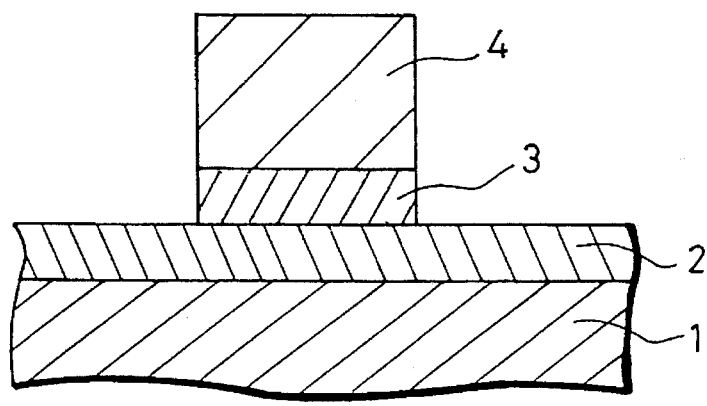
Figure 6:
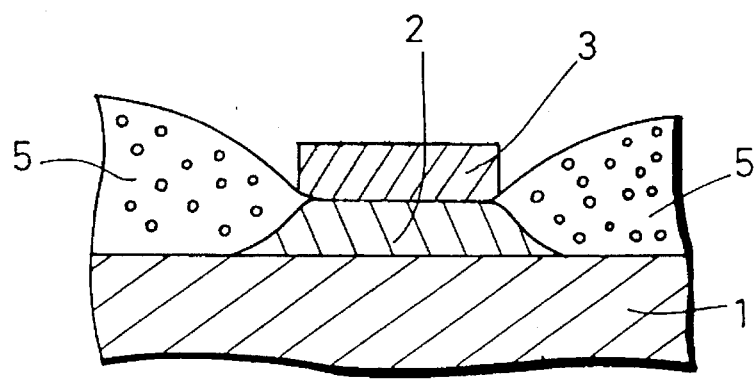

Referring to FIG. 5, using resist film 4 as mask, nitride film 3 is subjected to anisotropic reactive etching to take a prescribed form. Referring to FIG. 6, after removal of resist film 4, first insulating layers 5, 5 are formed on the upper surface of polysilicon layer 2 by thermal oxidation in accordance with LOCOS process. Referring to FIG. 6, gate electrode 2 having the central flat portion and the inclined sidewalls descending rightward and leftward from the right and left ends of the central flat portion is thus formed.

Figure 7:
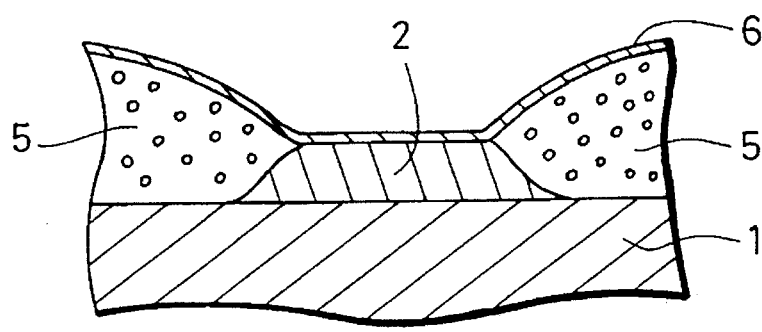
Figure 8:
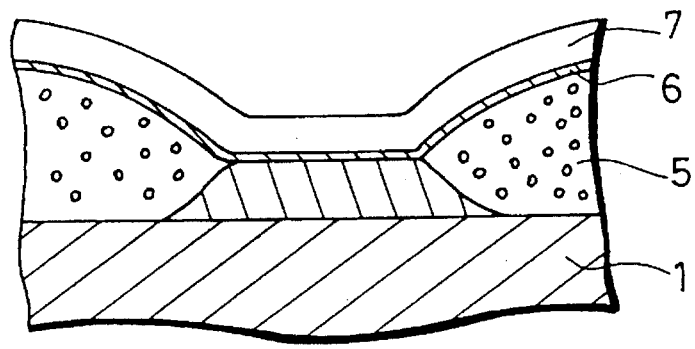
Figure 9:
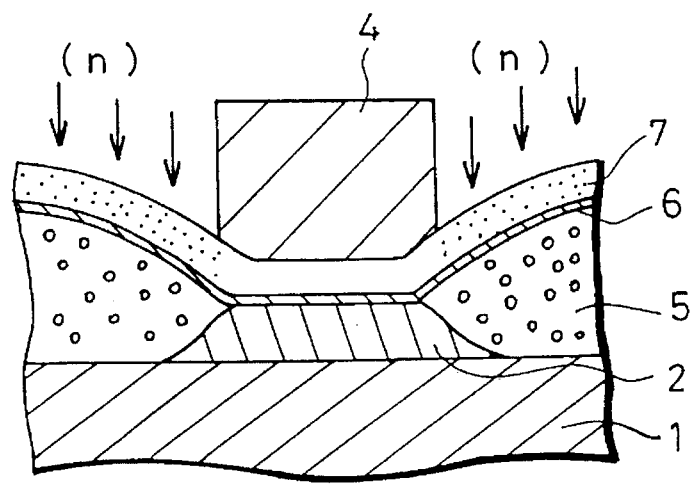
Figure 10:
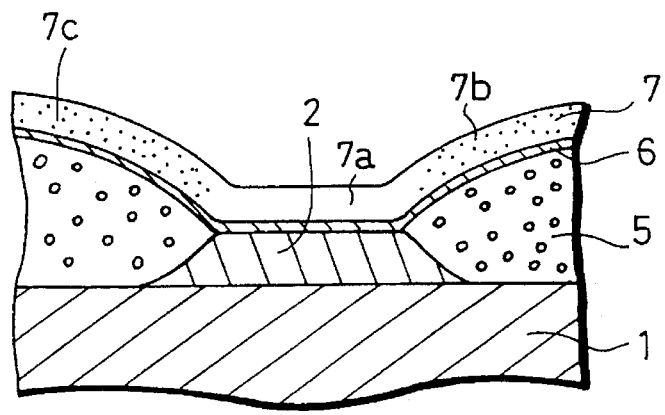

Referring to FIG. 7, after removal of nitride film 3, a gate oxide film 6 having a thickness of 50 nm is formed on the surfaces of gate electrode 2 and first insulating layers 5, 5 by means of thermal chemical vapor deposition. Referring to FIG. 8, a semiconductor layer, a polysilicon layer 7 is deposited as thick as 50 nm on gate oxide film 6 by thermal CVD. Referring to FIG. 9, a resist film 4 having a prescribed form is formed on the surface of semiconductor layer 7 at the position opposite to the central flat portion of gate electrode 2. Using resist film 4 as mask, an impurity of second type conductivity, for example, n type is introduced at a prescribed position of semiconductor layer 7. Referring to FIG. 10, channel region 7a of p type which is the first type conductivity is formed in semiconductor layer 7 at the position opposite to the central flat portion of gate electrode 2. Source/drain regions 7b, 7c of n type which is the second type conductivity are formed at the positions having channel region 7a therebetween. Thus, TFT in accordance with the present embodiment is completed.

The bent angle is formed to be beyond 90° in the vicinities of the boundaries of channel region 7a and source/drain regions 7b, 7c. Semiconductor layer 7 is therefore formed with no orthogonal bent produced. This allows the concentration of electric fields in channel region 7a to be suppressed.

A description of a structure of a TFT in accordance with a second embodiment in accordance with the present invention follows in conjunction with the accompanying drawings.

Figure 11:
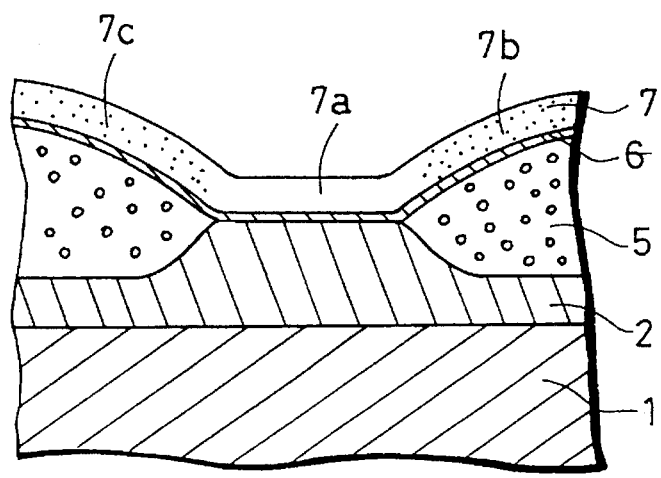
FIG. 11 is a cross sectional view showing a structure of a thin film transistor in accordance with a second embodiment of the present invention.

Referring to FIG. 11, the structure of the TFT in accordance with the second embodiment has a substantially identical structure to the TFT in the aforementioned first embodiment. The gate electrode 2 of the TFT described above has a structure isolated from first insulating layers 5, 5. The TFT in accordance with the second embodiment has polysilicon layer 2 for forming gate electrode 2 deposited thicker than usual. Thus, gate electrode 2 exists on the entire surface of interlayer insulating film 1.

Figure 13:
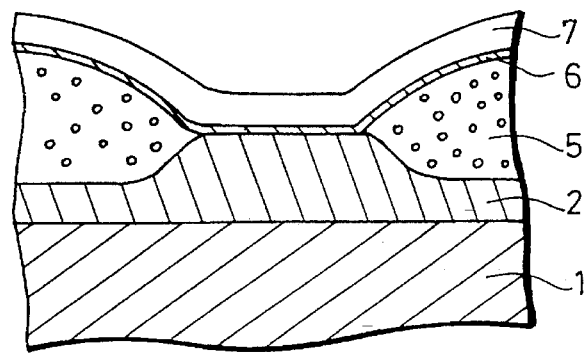
Figure 14:
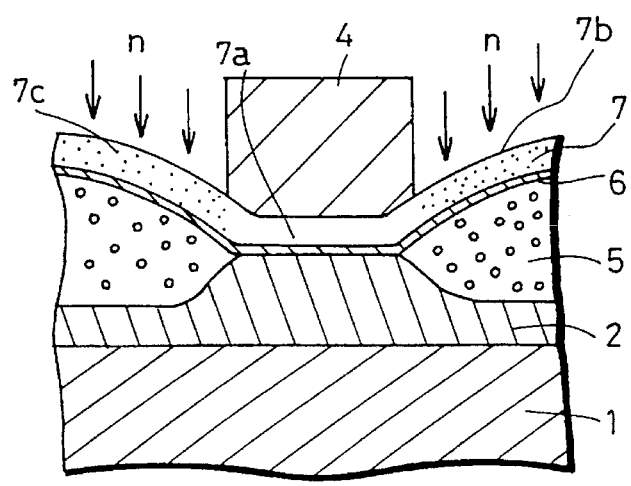

Now, a manufacturing process of the TFT in accordance with the second embodiment will be described in conjunction with FIGS. 12 to 14.

Figure 12:
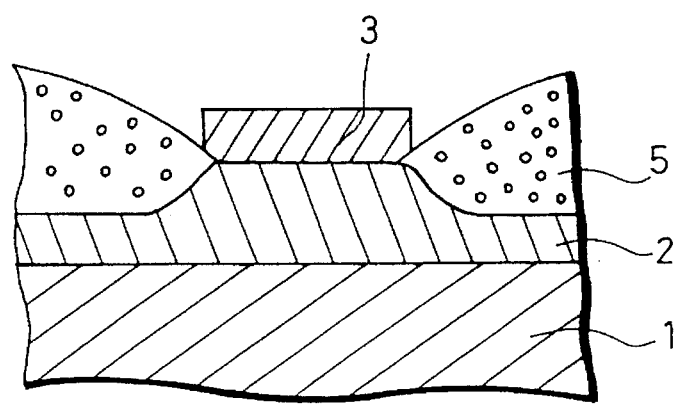
FIGS. 12 to 14 are cross sectional views showing a manufacturing process of the thin film transistor in accordance with the second embodiment of the present invention.

Referring to FIG. 12, an interlayer insulating film 1 is formed on a bulk transistor (not shown). A polysilicon layer 2 for forming a gate electrode is formed by thermal CVD on the interlayer insulating film as thick as 400 nm which is thicker than the case of the first embodiment. Thereafter, going through the same manufacturing process as the TFT in accordance with the first embodiment, the TFT in accordance with the second embodiment is formed.

Also in this structure, as is the case with the TFT in accordance with the first embodiment described above, the bent angle is formed to be beyond 90° in the vicinities of the boundaries of channel region 7a and source/drain regions 7b, 7c, and, therefore, an orthogonal bent is not formed in semiconductor layer 7. This allows the concentration of electric fields to be suppressed in channel region 7a. With gate electrode 2 existing on the entire surface of interlayer insulating film 1, making a contact with gate electrode 2 is possible at an arbitrary position on the substrate.

A structure of a TFT in accordance with a third embodiment of the present invention follows.

Figure 15:
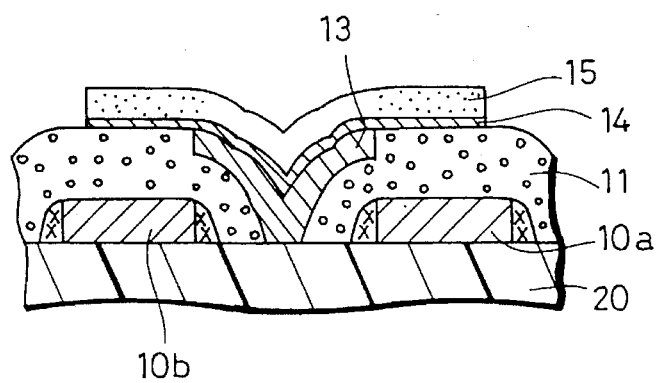
FIG. 15 is a cross sectional view showing a structure of a thin film transistor in accordance with a third embodiment of the present invention.

Referring to FIG. 15, the TFT in accordance with a third embodiment is formed between the gate electrode 10a and gate electrode 10b of the bulk transistor with sidewalls formed on a silicon substrate 20. First insulating layers 11, 11 are formed on gate electrode 10a and gate electrode 10b. The gate electrode 13 of the TFT having an approximately V shape is formed on first insulating layers 11, 11. A gate oxide film 14 is formed on the surfaces of first insulating layers 11, 11 and gate electrode 13. A channel layer 15 is formed on the upper surface of gate oxide film 14.

A manufacturing process of the TFT in accordance with the third embodiment will be described in conjunction with FIGS. 16 to 22.

Figure 16:
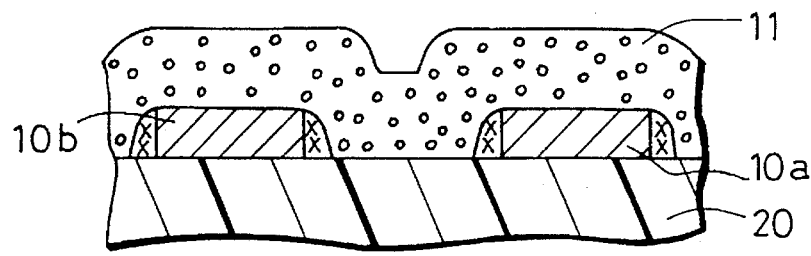
FIGS. 16 to 22 are cross sectional views showing a manufacturing process of the thin film transistor in accordance with the third embodiment of the present invention.
Figure 17:
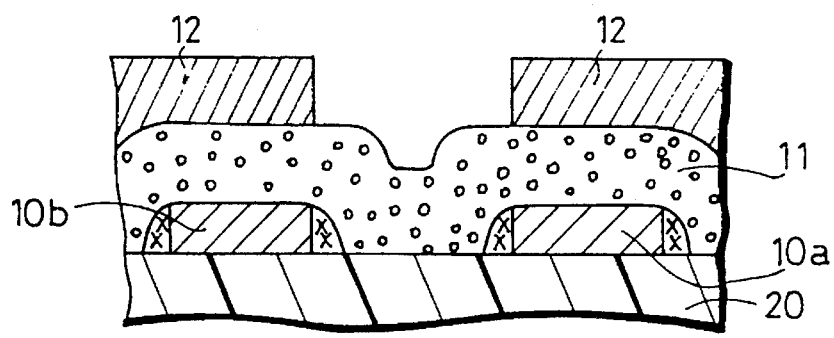
Figure 18:
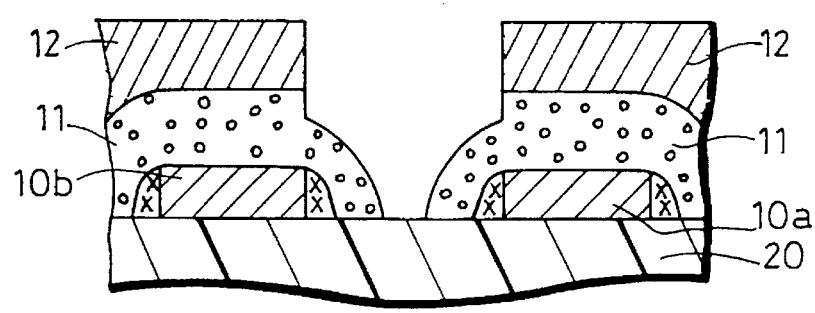

Referring to FIG. 16, formed on semiconductor substrate 20 are gate electrodes 10a and 10b. First insulating layer 11 is deposited as thick as 300 nm on gate electrodes 10a and 10b by thermal chemical vapor deposition. Referring to FIG. 17, a resist film patterned into a prescribed form is formed on interlayer insulating film 11 by a photolithography technique. Referring to FIG. 18, first insulating layer 11 between gate electrodes 10a and 10b is removed away by anisotropic reactive ion etching, thereby forming an opening leading to semiconductor substrate 20.

Figure 19:
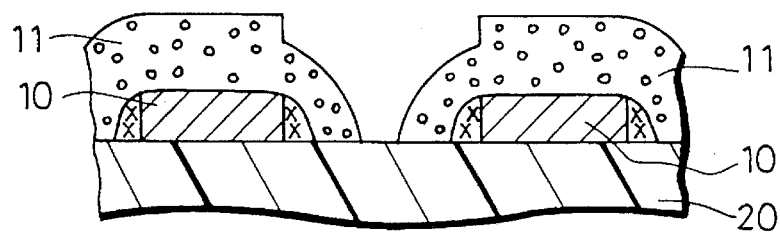
Figure 20:
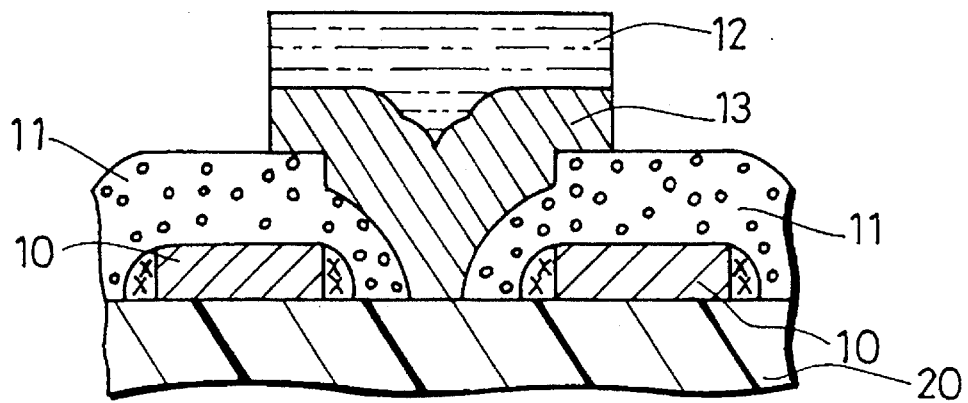
Figure 21:
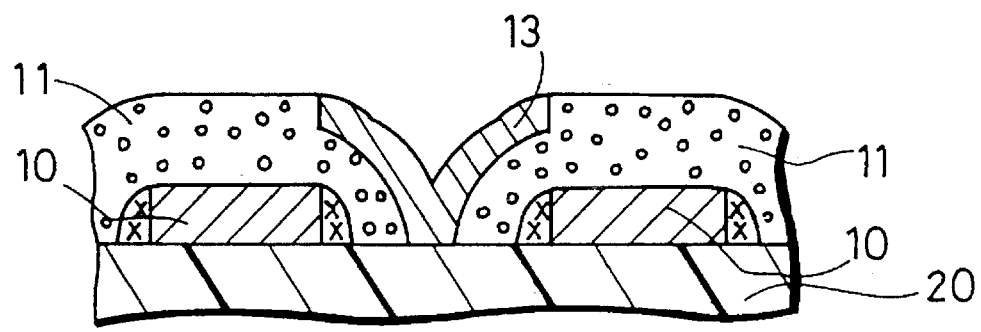

Referring to FIG. 19, resist film 12 is removed. Referring to FIG. 20, polysilicon layer 13 for gate electrode is deposited as thick as 300 nm on interlayer insulating film 11 by thermal chemical vapor deposition. Thereafter, resist film 12 is applied onto polysilicon layer 13. Resist film 12 is then patterned into a prescribed form by a photolithography technique. Referring to FIG. 21, resist film 12 is removed. Thereafter, TFT gate electrode 13 is formed by anisotropic reactive ion etching.

Figure 22:
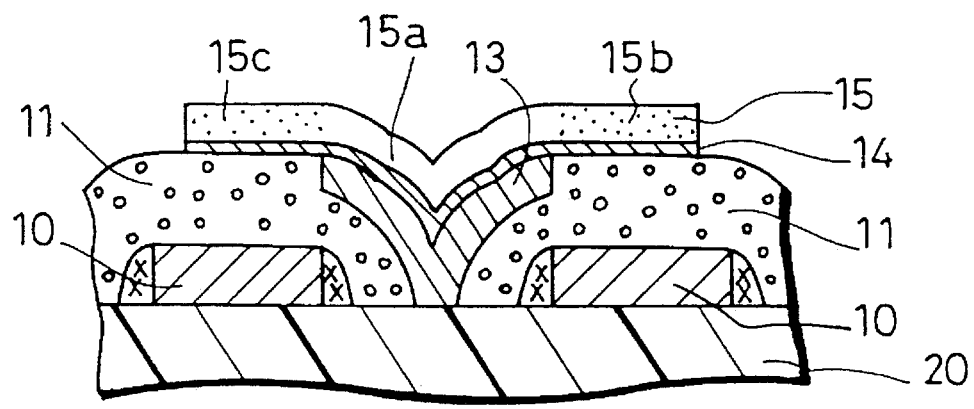

Referring to FIG. 22, gate oxide film 14 having a thickness of 50 nm is formed on gate electrode 13 and first insulating layers 11, 11 by thermal CVD. Polysilicon layer 15 for forming the TFT semiconductor layer is deposited as thick as 50 nm on gate oxide film 14 by thermal CVD. Thereafter, a resist film (not shown) is formed on the surface of polysilicon layer 15 opposite to gate electrode 13. Using the resist film as mask, an impurity of the second type conductivity is introduced at a prescribed position of polysilicon layer 15. Thus, polysilicon layer 15 is formed with no orthogonal bent formed. Channel region 15a of first type conductivity, for example, p type is formed at the position opposite to gate oxide film 13. Source/drain regions 15b, 15c of second type conductivity, for example, n type are formed at positions having channel region 15a therebetween.

According to the above-stated structure, the bent angle in the vicinities of the boundaries of channel region 15a and source/drain regions 15b, 15c is formed to be beyond 90°. The concentration of electric fields can therefore be suppressed by the formation of the semiconductor layer with no orthogonal bent produced in the semiconductor layer.

Now, a TFT in accordance with a fourth embodiment of the present invention will be described in conjunction with the accompanying drawings.

Figure 23:
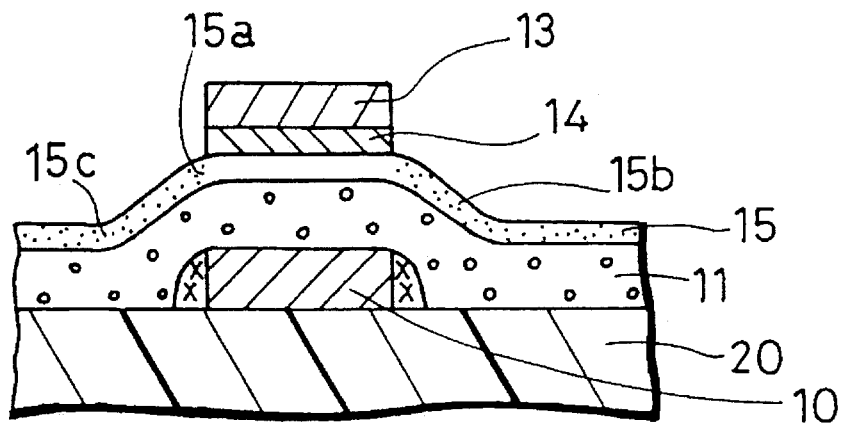
FIG. 23 is a cross sectional view showing a structure of a thin film transistor in accordance with a fourth embodiment of the present invention.
Figure 24:
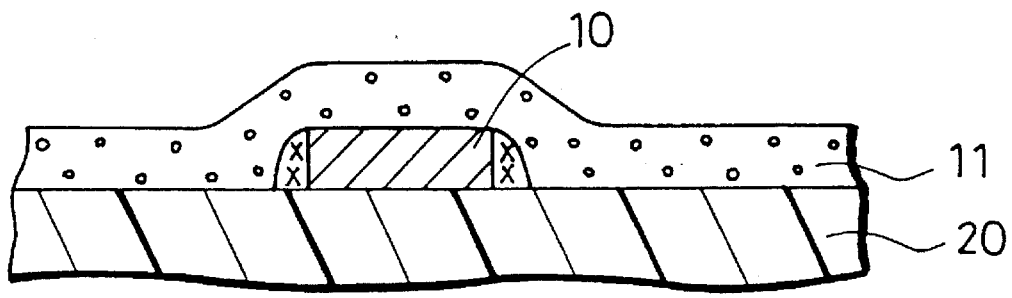
FIGS. 24 to 29 are cross sectional views showing a manufacturing process of the thin film transistor in accordance with the fourth embodiment of the present invention.
Figure 25:
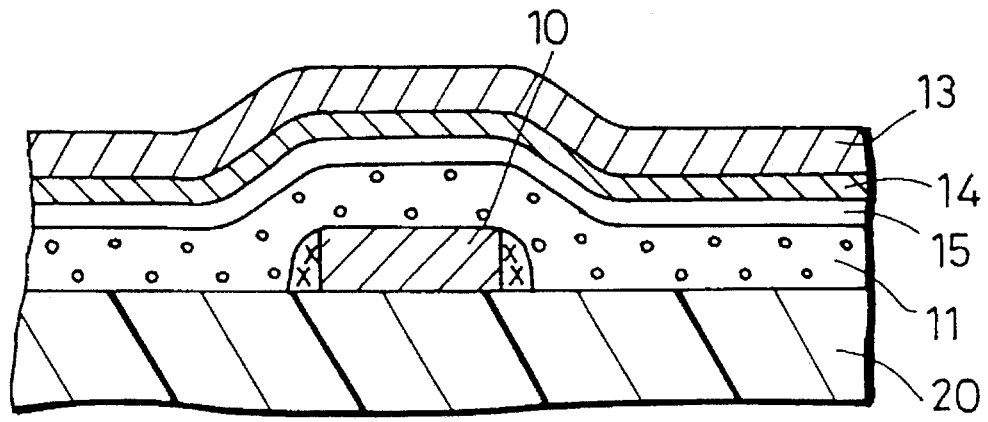

Referring to FIG. 23, the TFT in accordance with the fourth embodiment is formed immediately above the gate electrode 10 of bulk transistor. A description of a manufacturing process of the TFT having this structure follows in conjunction with FIGS. 24 to 29. Referring to FIG. 24, first insulating layer 11 is formed on the gate electrode 10 of the bulk transistor. Referring to FIG. 25, a semiconductor layer 15 formed of polysilicon is deposited on the surface of first insulating layer 11 by thermal CVD. Thereafter, a gate oxide film 14 is formed on the semiconductor layer 15. Gate electrode layer 13 is formed on gate oxide film 14.

Figure 26:
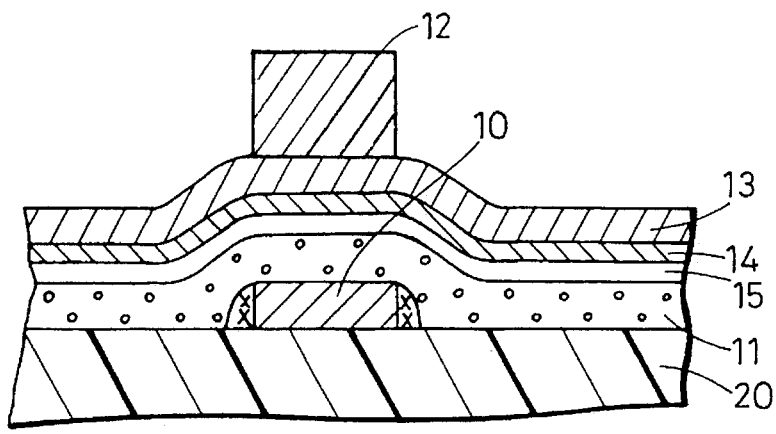
Figure 27:
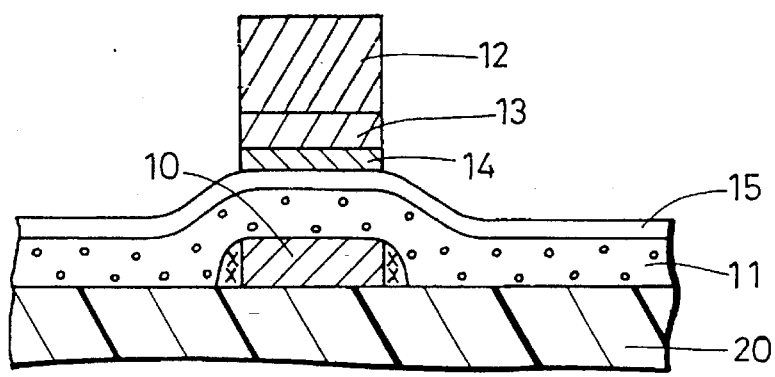
Figure 28:
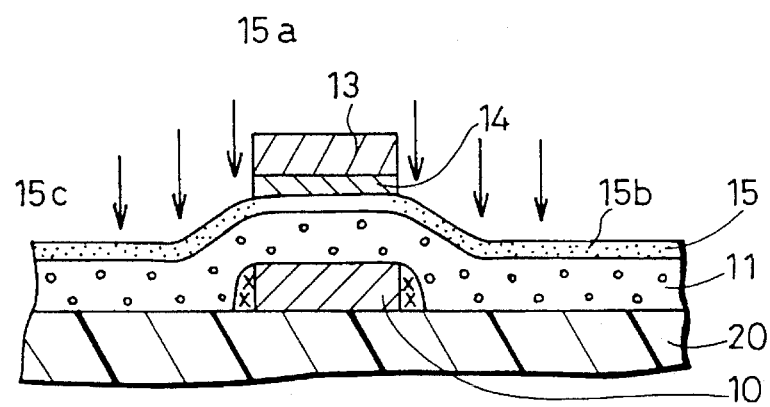
Figure 29:
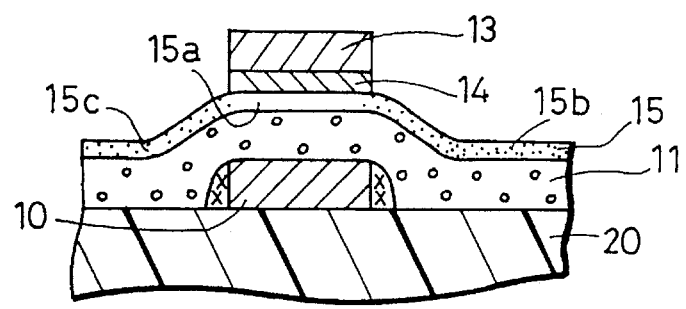

Referring to FIG. 26, a resist film 12 is applied onto gate electrode layer 13 and the structure is etched into a prescribed form by means of a photolithography technique. Referring to FIG. 27, using resist film 12 as mask, gate electrode layer 13 and gate oxide film 14 are subjected to reactive anisotropic ion etching into prescribed forms. Referring to FIG. 28, resist film 12 is removed away. Thereafter, using gate electrode 13 as mask, an impurity of the second type conductivity is introduced into semiconductor layer 15. Referring to FIG. 29, a p type channel region 15a is formed in semiconductor layer 15 which is the lower portion of the gate electrode 13 of the TFT. N source/drain regions 15b, 15c are formed in the right and left regions of semiconductor layer 15 having p channel region 15a therebetween. Thus, the TFT in accordance with the fourth embodiment is completed.

As described above, the formation of the TFT immediately above bulk transistor 10 allows suppression of the concentration of electric fields at a bent, because the bent angle at each of the positions in the vicinities of the boundaries of channel region 15a and source/drain regions 15b, 15c is formed to be beyond 90° and an orthogonal bent is not formed in semiconductor layer 15.

Now, a description of a TFT in accordance with the fifth embodiment of the present invention follows.

Figure 30:
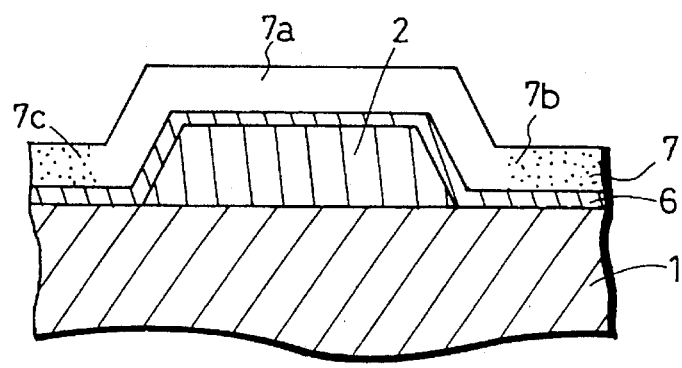
FIG. 30 is a cross sectional view showing a structure of a thin film transistor in accordance with a fifth embodiment of the present invention.

Referring to FIG. 30, in the structure of the TFT in accordance with the fifth embodiment, a gate electrode 2 having a central flat portion and sidewalls formed broaden downwardly at a prescribed inclination with respect to both sides of the central flat portion is formed on an interlayer insulating film 1. A gate oxide film 6 is formed along the central flat portion and sidewalls of gate electrode 2. A semiconductor layer 7 is formed along the surface of gate oxide film 6. A channel region 7a of first type conductivity, for example, p type is formed at the position opposite to the central flat portion of gate electrode 2. Source/drain regions 7b, 7c of second type conductivity, for example, n type are formed at the positions having p type channel region 7a therebetween.

A manufacturing process of the TFT having the above-stated structure will be described in conjunction with FIGS. 31 to 36.

Figure 31:
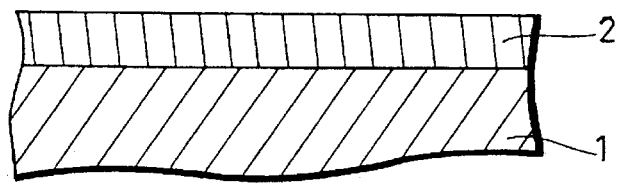
FIGS. 31 to 36 are cross sectional views showing a manufacturing process of the thin film transistor in accordance with the fifth embodiment of the present invention.
Figure 32:
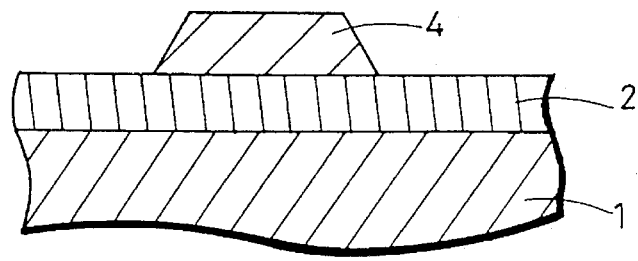
Figure 33:
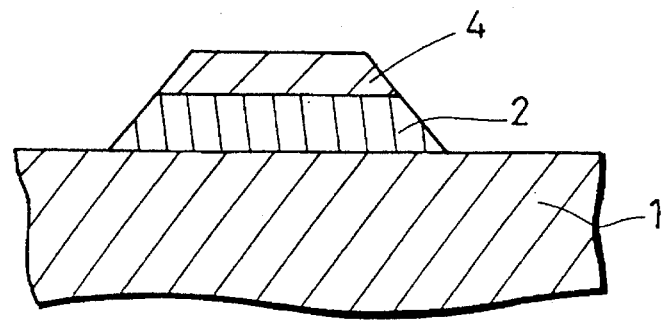
Figure 34:
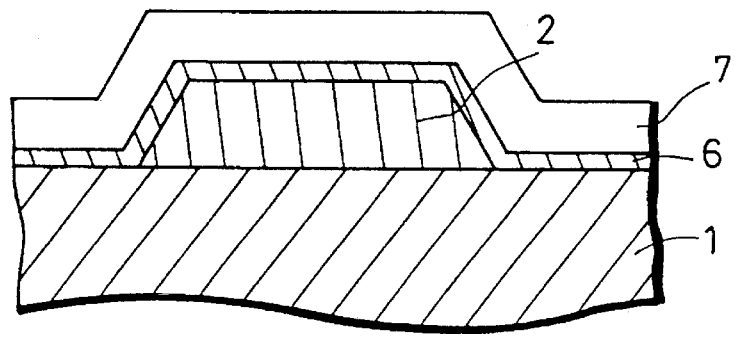
Figure 35:
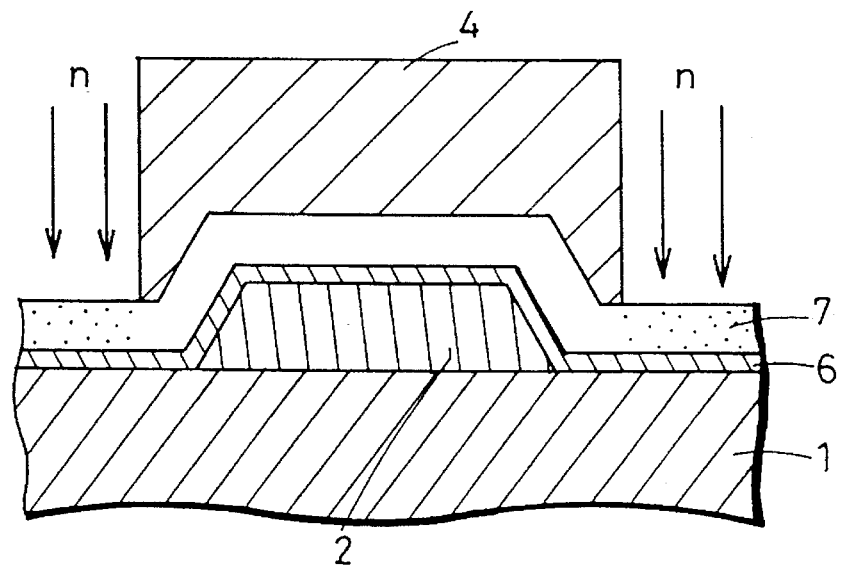
Figure 36:
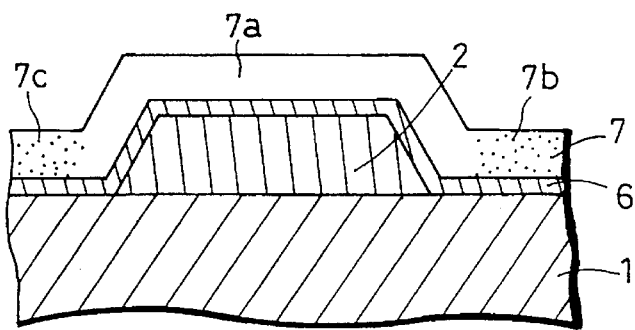

Referring to FIG. 31, a polysilicon layer 2 to form a gate electrode is formed on interlayer insulating film 1. Referring to FIG. 32, a resist film having a central flat portion and sidewalls formed broaden downwardly at a prescribed inclination angle with respect to both sides of the central flat portion. Referring to FIG. 33, using resist film 4 as mask, polysilicon layer 2 is subjected to reactive anisotropic ion etching, thus, polysilicon layer 2 is formed to be gate electrode 2 corresponding to the form of resist film 4 and having a central flat portion and sidewalls formed broaden downwardly having a prescribed inclination with respect to both sides of the central flat portion. Referring to FIG. 34, resist film 4 is removed away. Thereafter, a gate oxide film 6 is formed on gate electrode 2. Semiconductor layer 7 is formed on gate oxide film 6. Referring to FIG. 35, resist film 4 having a prescribed form is formed in the area opposite to the surface of the semiconductor layer 7 of gate electrode 2. Using resist film 4 as mask, an impurity of second type conductivity, for example, n type is introduced into semiconductor layer 7. Thus, channel region 7a of the first type conductivity, for example, p type is formed in the region opposite to the gate electrode 2 of semiconductor layer 7. Source/drain regions 7b, 7c of the second type conductivity, for example, n type are formed at the positions of semiconductor layer 7 having channel region 7a therebetween. Thus, the TFT in accordance with the fifth embodiment is completed. In the TFT having the above-stated structure, as the bent angle in the vicinities of the boundaries of channel region 7a and source/drain regions 7b, 7c is formed to be beyond 90°, no orthogonal bent is formed in semiconductor layer 7, and, therefore, the concentration of electric fields in the orthogonal bent of the conventional semiconductor layer can be suppressed.

Figure 37:
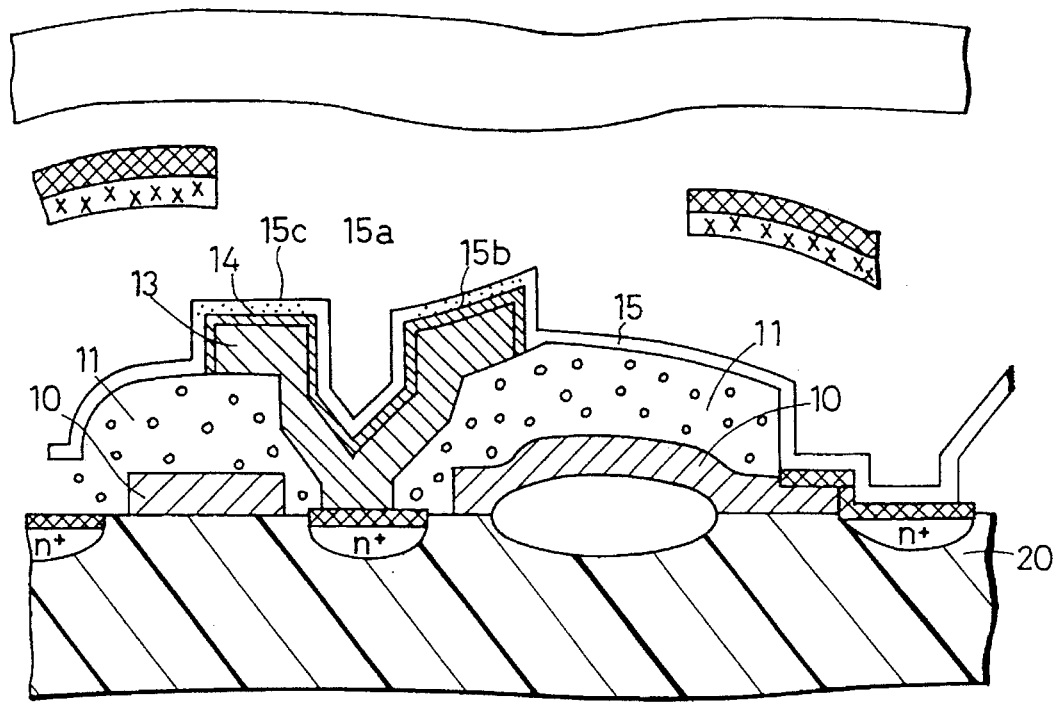
FIG. 37 is a cross sectional view showing a structure of a thin film transistor in accordance with a third embodiment of the present invention, being used in an SRAM memory cell.
Figure 38:
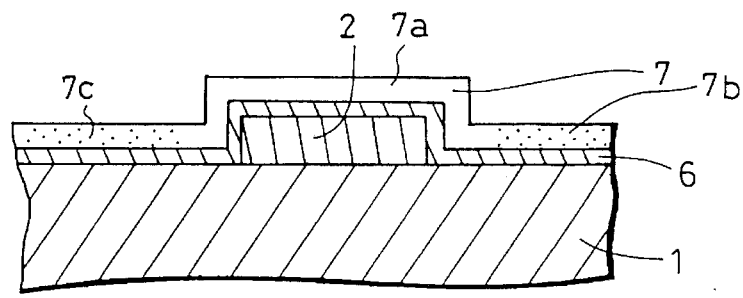
FIGS. 38 is a cross sectional view showing a structure of a thin film transistor in accordance with a conventional technique.
Figure 39:
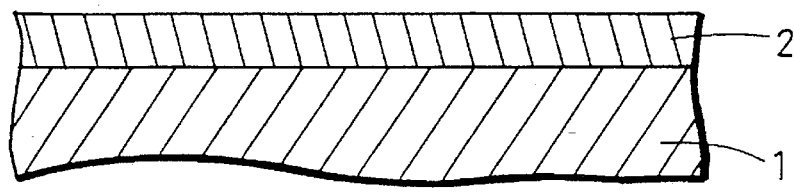
FIGS. 39 to 45 are cross sectional views showing a manufacturing process of the thin film transistor in accordance with the conventional technique.
Figure 40:
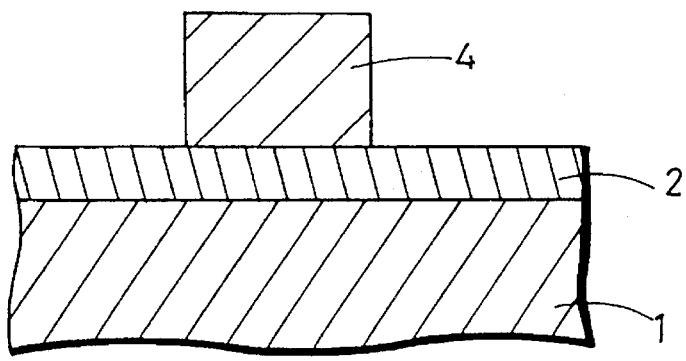
Figure 41:
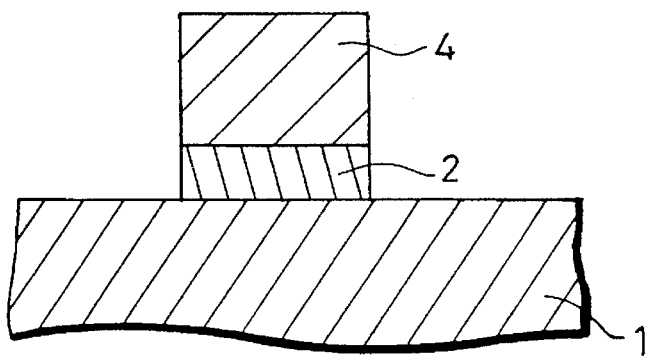
Figure 42:
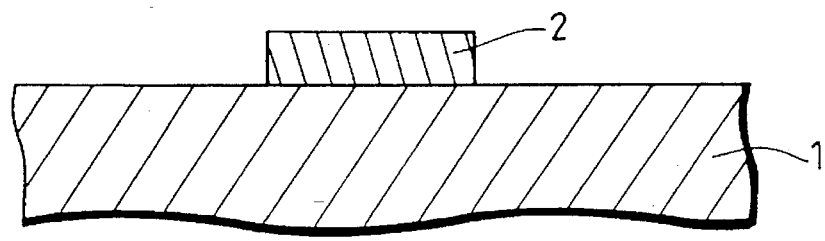
Figure 43:
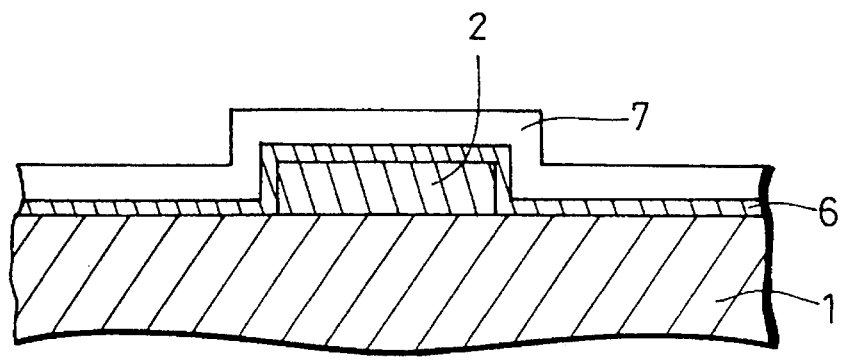
Figure 44:
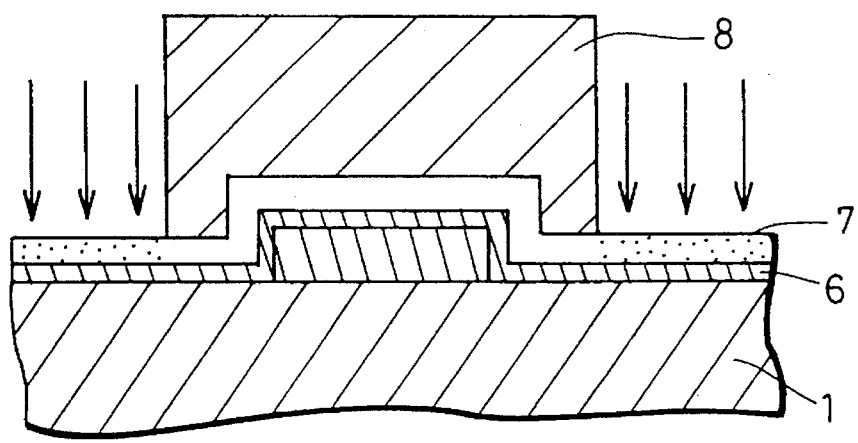
Figure 45:
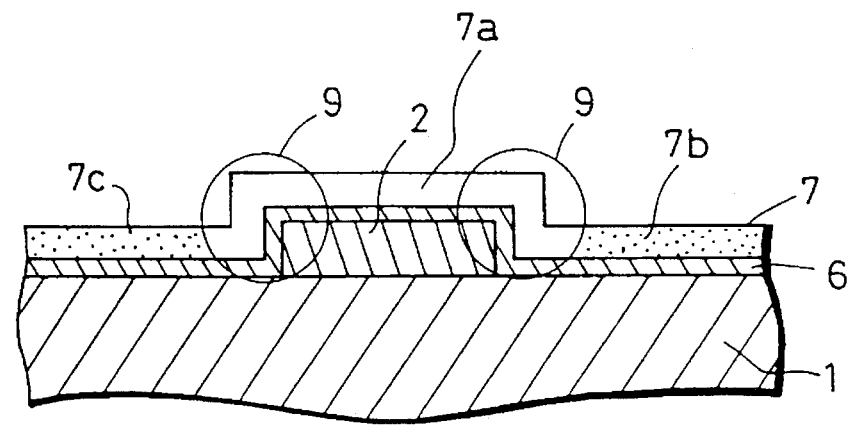

Referring to FIG. 37, a cross section of the TFT in accordance with the third embodiment used for an SRAM memory cell is shown.

As in the foregoing, according to the embodiments of the present invention, the semiconductor layer formed in the thin film transistor is formed in such a manner that no orthogonal bent is produced. Thus, the concentration of electric fields in the orthogonal bent of the semiconductor layer according to the conventional technique can be prevented. Furthermore, hot carriers created by the concentration of electric fields can be suppressed from getting into the insulating film. Consequently, a stable operation of the semiconductor device is secured, and a highly reliable TFT can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate;

a first gate electrode of a bulk transistor and a second gate electrode of a bulk transistor horizontally spaced apart from each other on a surface of said semiconductor substrate with a gate insulating film between said first and second gate electrodes and said semiconductor substrate;

a third gate electrode of a thin film transistor having a central portion between said first and second gate electrodes and connected to a portion of said semiconductor substrate between said first and second gate electrodes;

a first insulating layer separating said third gate electrode from said first and second gate electrodes;

a second insulating layer formed on the surfaces of said first gate electrode and said first insulating layer; and a semiconductor layer of a first conductivity type formed on the surface of the second insulating layer, said semiconductor layer of the first conductivity type having a channel region of the first conductivity type at a position vertically aligned and above said central portion of said third gate electrode and source/drain regions of a second conductivity type having the channel region therebetween.

2. A semiconductor device as recited in claim 1, wherein said first gate electrode has an upper surface and side surfaces, and said second insulating layer is formed in contact with the upper surface of the first gate electrode and is separated from the side surfaces by said first insulating layer.

3. The semiconductor device according to claim 1, wherein said first and second gate electrodes are gate electrodes of the same bulk transistor.

4. The semiconductor device according to claim 1, wherein said first and second gate electrodes are gate electrodes of different bulk transistors.

5. A semiconductor device comprising:

a semiconductor substrate;

a first gate electrode of a bulk transistor formed on said substrate with a gate insulating layer therebetween;

a second gate electrode of a thin film transistor formed on said substrate and said first gate electrode with an insulating layer therebetween, said second gate electrode connected electrically to a source/drain region of said bulk transistor;

a semiconductor layer formed on said semiconductor substrate and having a channel region of a thin film transistor formed on said second gate electrode with a gate insulating layer therebetween and a pair of source/drain regions of said thin film transistor.

6. A semiconductor device, comprising:

a semiconductor substrate;

first and second gate electrodes of bulk transistors, which sandwich a prescribed region of a surface of said semiconductor substrate therebetween, and each of which is formed on said semiconductor substrate with a first gate insulating film therebetween;

a semiconductor layer formed on said first and second gate electrodes and above said semiconductor substrate so as to be electrically insulated from said first and second gate electrodes and having a channel region of a thin film transistor above said prescribed region, which protrudes towards said semiconductor substrate; and a gate electrode of the thin film transistor formed to be opposed to said channel region of said semiconductor layer with a second gate insulating film therebetween.

7. The semiconductor device according to claim 6, wherein said semiconductor layer includes source/drain regions of the thin film transistor in a region opposite to said first and second gate electrodes.

* * * * *